United States Patent
Okada et al.

(10) Patent No.: US 7,679,174 B1
(45) Date of Patent: Mar. 16, 2010

(54) SEMICONDUCTOR DEVICE AND MEMORY CARD USING THE SAME

(75) Inventors: Takashi Okada, Yokohama (JP); Kiyokazu Okada, Yokkaichi (JP); Akinori Ono, Mie-gun (JP); Taku Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 11/691,716

(22) Filed: Mar. 27, 2007

(30) Foreign Application Priority Data

Mar. 31, 2006 (JP) ............................. 2006-098271
Oct. 11, 2006 (JP) ............................. 2006-277884

(51) Int. Cl.
*H01L 23/02* (2006.01)

(52) U.S. Cl. ....................... 257/679; 257/784; 257/786; 257/E23.024; 361/736; 361/737; 361/748

(58) Field of Classification Search ................. 257/679, 257/734, 690, 693, 700, 784, 786, E23.024; 235/487, 441, 492; 361/736, 737, 748
See application file for complete search history.

(56) References Cited

U.S. PATENT DOCUMENTS 7,048,197 B2 * 5/2006 Nishizawa et al. .......... 235/492
7,293,716 B1 * 11/2007 Miks .......................... 235/492
2005/0011671 A1 * 1/2005 Takiar et al. ................ 174/256
2005/0253239 A1   11/2005 Nishizawa et al.

FOREIGN PATENT DOCUMENTS

| CN | 1744110 A     | 3/2006  |
|----|---------------|---------|
| EP | 1 591 949 A2  | 11/2005 |
| JP | 2005-339496   | 12/2005 |
| KR | 10-2006-0045823 | 5/2006 |

* cited by examiner

*Primary Examiner*—Anh Phung
*Assistant Examiner*—Allison P Bernstein
(74) *Attorney, Agent, or Firm*—Oblon, Spivak, McClelland, Maier & Neustadt, L.L.P.

(57) ABSTRACT

A circuit board has a curved portion provided in at least one side of an external shape thereof. An external connecting terminal is provided on a first main surface of the circuit board. A semiconductor element is mounted on a second main surface of the circuit board. A first wiring network is provided in a region except the terminal region on the first main surface. A second wiring network is provided on the second main surface. Distance from the side including the curved portion to the first wiring network is larger than distance from at least one of the other sides to the first wiring networks, and distance from the side including the curved portion to the second wiring network is larger than distance from at least one of the other sides to the second wiring networks.

20 Claims, 10 Drawing Sheets

SEMICONDUCTOR DEVICE AND MEMORY CARD USING THE SAME

CROSS-REFERENCE TO THE RELATED APPLICATION

This application is based upon and claims the benefit of priority from the prior Japanese Patent Application No. 2006-098271 filed on Mar. 31, 2006 and the prior Japanese Patent Application No. 2006-277884 field on Oct. 11, 2006; the entire contents of which are incorporated herein by reference.

BACKGROUND OF THE INVENTION

1. Field of the Invention

The present invention relates to a semiconductor device and a memory card using the same.

2. Description of the Related Art

Semiconductor memory cards having a NAND type flash memory or the like built therein are downsized while having larger capacity. For instance, SD (trademark) memory card is presented in three sizes, a size of a normal SD (trademark) card, a size of a mini SD (trademark) card and a size of a micro SD (trademark) card, in which even the micro SD (trademark) card is expected to have a larger capacity. In an attempt to increase the capacity of the downsized memory card, it is examined and put into practical use that the semiconductor device having a built-in semiconductor element such as a memory element, a controller element or the like forms the memory card without being accommodated in a case such as a base card.

In order to manufacture a small-sized memory card, a circuit board frame, in which regions to form a plurality of memory cards are arranged in a matrix manner, is prepared at first. An external connecting terminal is formed in each of the card-forming regions by electrolytic plating or the like, and after that a semiconductor element is mounted on a rear surface side. Subsequently, the semiconductor elements and the circuit boards are electrically connected and a sealing resin is formed by molding on the rear surface of the circuit board frame to seal the semiconductor elements mounted on the plurality of card-forming regions all at once.

The circuit board frame together with the sealing resin is cut in accordance with the card forming regions to manufacture the plurality of memory cards all at once. A cut-out portion, a constricted portion and the like indicating a head or rear direction and an upper or lower direction of the card when the card is equipped into a card slot is provided at an outer peripheral portion of the memory card. In the memory card formed by accommodating the semiconductor device in the case, the cut-out portion, the constricted portion and the like are formed at the case. In the memory card formed by the semiconductor device only without using the case, the cut-out portion, the constricted portion and the like need to be formed at the semiconductor device itself.

When cutting the circuit board frame, a blade dicing being highly speedy is adopted in general. Since the cut-out portion and the constricted portion have a complicated form including a curved portion, the adoption of a laser beam machining or a water jet machining is under consideration. However, these machining methods have a problem of a low cutting speed compared with the blade dicing. When the laser beam machining or the water jet machining is adopted to cut the entire outline, a machining efficiency down in the cutting step of the circuit board frame is unavoidable.

The curved portion needs to be cut at a lower speed than the speed to cut the linear portion, in which the machining efficiency downs further. Of the laser machining and the water jet machining effective for cutting the curved portion, the laser machining exhibits a higher cutting efficiency as compared to the water jet machining, whereas a cooling efficiency thereof downs at the time of a low-speed cutting, in which a problem of heat generation is caused at the cut portion. Affected by the heat generated at the time of the cutting, there arise problems such as an insulation performance down between the wirings, a short circuit caused by carbonized resist or core material composing the circuit board, and further an easily-caused characteristic degradation of the semiconductor element.

SUMMARY OF THE INVENTION

A semiconductor device according to an aspect of the present invention includes: a substrate including a first main surface, a second main surface on an opposite of the first main surfaces, and a curved portion provided in at least one side of an external shape thereof; a semiconductor element mounted on at least one of the first and second main surfaces of the substrate; and a wiring network provided on at least one of the first and second main surfaces of the substrate, wherein distance from the side including the curved portion of the substrate to the wiring network is larger than distance from at least one of the other sides of the substrate to the wiring network.

A semiconductor device according to another aspect of the present invention includes: a substrate including a first main surface, a second main surface on an opposite of the first main surface, and a curved portion provided in at least one side of an external shape thereof; an external connecting terminal formed on the first main surface of the substrate; a first wiring network provided in a region except a region formed the external connecting terminal on the first main surface of the substrate; a second wiring network provided on the second main surface of the substrate; and a semiconductor element mounted on the second main surface of the substrate, wherein distance from the side including the curved portion of the substrate to the first wiring network is larger than distance from at least one of the other sides of the substrate to the first wiring network, and distance from the side including the curved portion of the substrate to the second wiring network is larger than distance from at least one of the other sides of the substrate to the second wiring network.

A memory card according to an aspect of the present invention includes: a substrate including a first main surface, a second main surface on an opposite of the first main surface, and a curved portion provided in at least one side of an external shape thereof; an external connecting terminal formed on the first main surface of the substrate; a first wiring network provided in a region except a region formed the external connecting terminal on the first main surface of the substrate; an insulating layer formed on the first main surface of the substrate to cover the first wiring network; a second wiring network provided on the second main surface of the substrate; a semiconductor memory element mounted on the second main surface of the substrate; and a sealing resin layer formed on the second main surface of the substrate to seal the semiconductor memory element, wherein distance from the side including the curved portion of the substrate to the first wiring network is larger than distance from at least one of the other sides of the substrate to the first wiring network, and distance from the side including the curved portion of the substrate to the second wiring network is larger than distance from at least one of the other sides of the substrate to the second wiring network.

DESCRIPTION OF THE EMBODIMENTS

Figure 1:
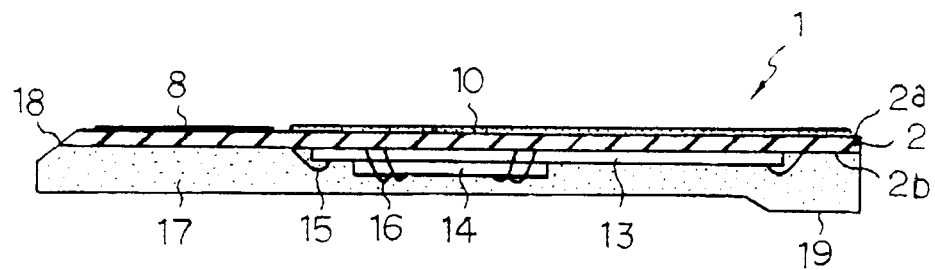
FIG. 1 is a sectional view showing a structure of a semiconductor device according to an embodiment of the present invention.
Figure 2:
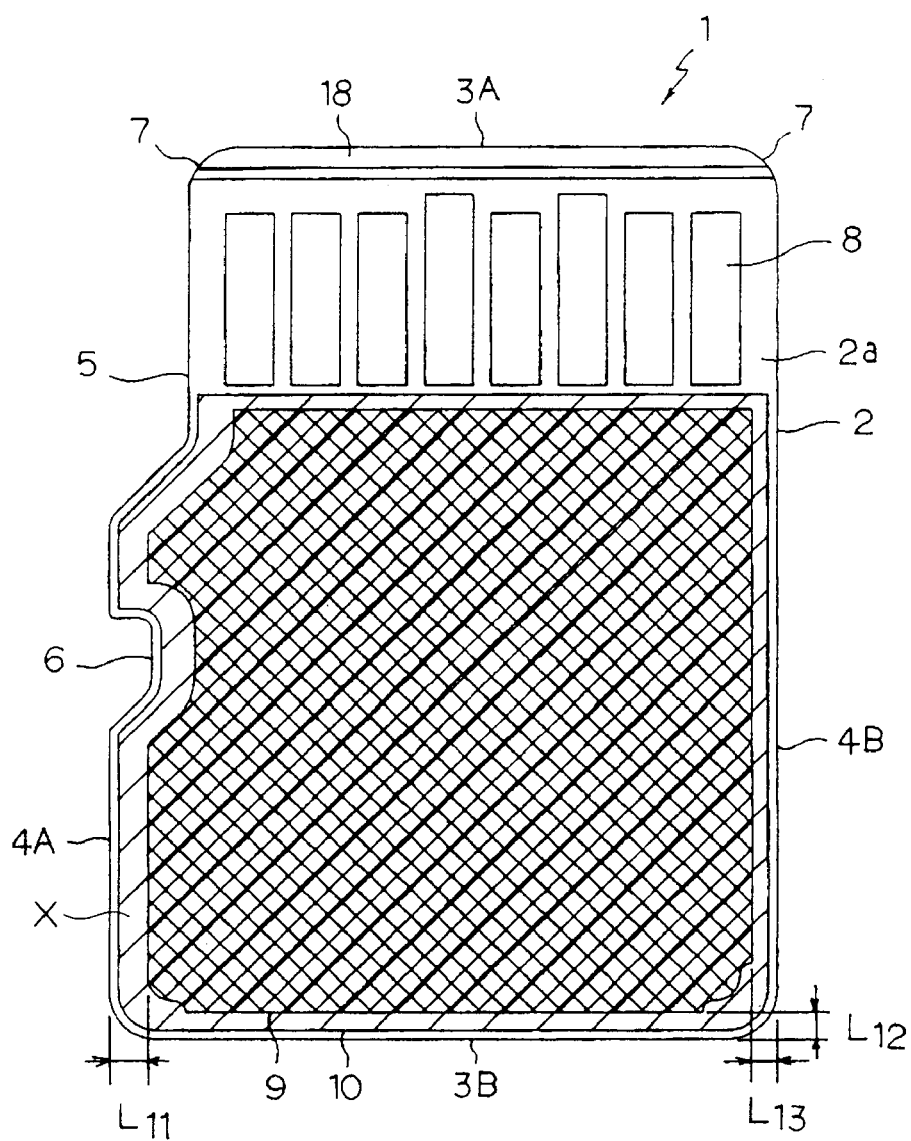
FIG. 2 is a plan view showing the semiconductor device shown in FIG. 1.
Figure 3:
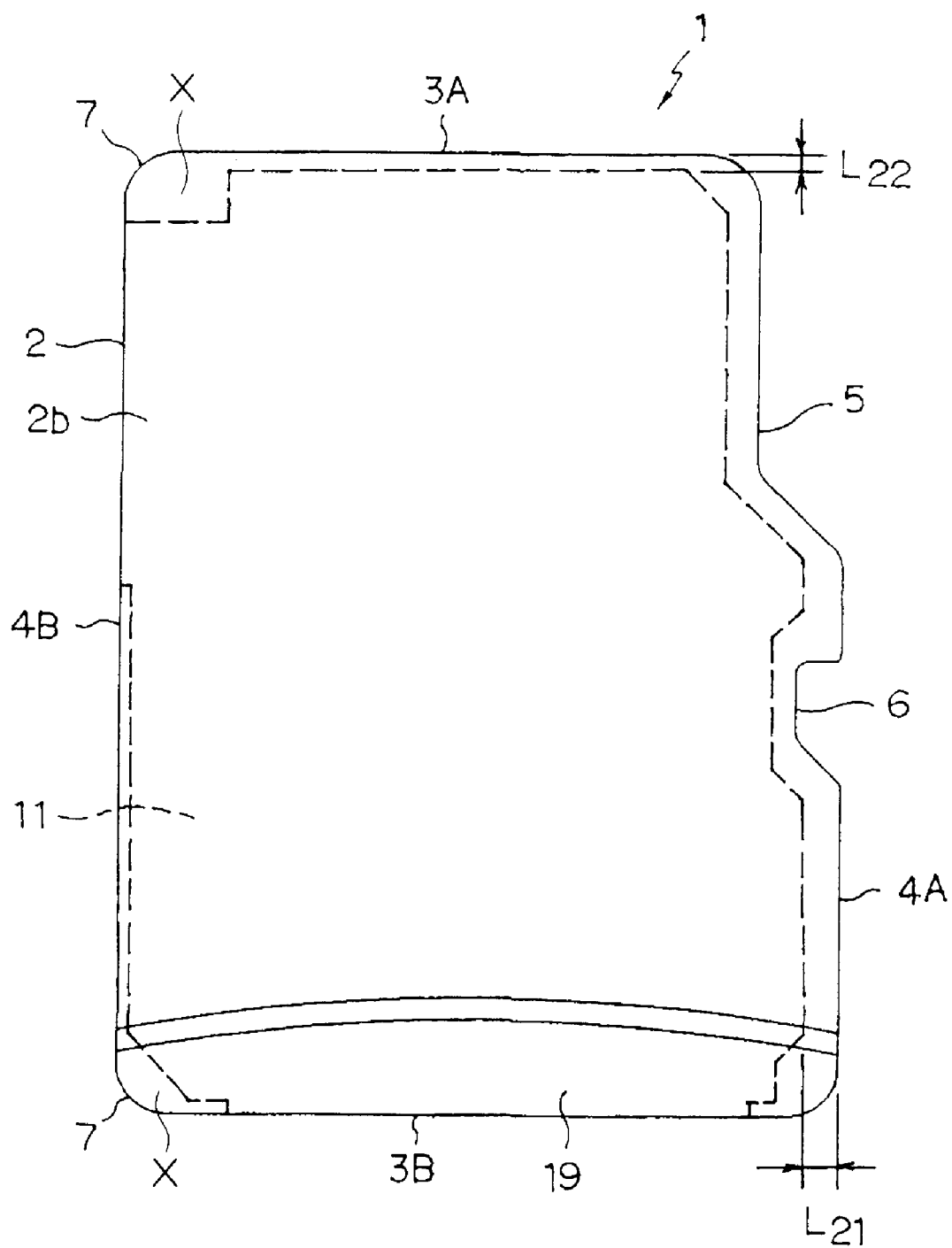
FIG. 3 is a rear view showing the semiconductor device shown in FIG. 1.

Hereinafter, a mode to embody the present invention will be described with reference to the drawings. FIG. 1, FIG. 2 and FIG. 3 are views showing a structure of a semiconductor device according to an embodiment of the present invention, in which FIG. 1 is a sectional view of the semiconductor device, FIG. 2 is a plan view (upper view) thereof and FIG. 3 is a rear view thereof. A semiconductor device 1 shown in these view is composed of a memory card, and the semiconductor device 1 is used by itself as, for example, a micro SD (trademark) standard memory card (microSD (trademark) card). The semiconductor device 1 includes a circuit board 2 serving as a terminal forming substrate and an element mounting substrate.

The circuit board 2 is formed, for example, by providing a wiring network inside or on a surface of an insulating resin substrate, and specifically, a print circuit board using glass epoxy resin, BT resin (Bsmaleimide-Triazine resin) or the like is applicable. The circuit board 2 includes a first main surface 2a to be a terminal forming surface and a second main surface 2b to be an element mounting surface. The circuit board 2 has substantially a rectangular shape in appearance. A short side 3A corresponds to a head portion when inserting the memory card into a card slot. Another short side 3B corresponds to a rear portion of the memory card.

A long side 4A of the circuit board 2 is provided with a cut-out portion 5 and a constricted portion 6 indicating the head, rear, upper and lower direction of the memory card. The cut-out portion 5 is formed by cutting out the corner portion between the short side 3A and the long side 4A and a part of the long side 4A continued therefrom to make the short side 3A be smaller than the short side 3B. The constricted portion 6 is formed by cutting out a part of the long side 4A into substantially a trapezoidal shape. The cut-out portion 5 and the constricted portion 6 have a complicated shape including a curved portion, respectively, and thereby shape the circuit board 2 into a complicated shape in appearance as well.

The long side 4A of the circuit board 2 includes the cut-out portion 5 and the constricted portion 6 having a curved portion as a part of their shapes, respectively. Further, respective corner portions 7 of the circuit board 2 are designed to be curved (have an R shape). Although, here, the cut-out portion 5 and the constricted portion 6 are described separately, these portions may be collectively referred to as a portion formed by cutting out a part of the side composing the external form of the circuit board 2. The semiconductor device 1 is effective when using the circuit board 2 including the cut-out portion as described above. Further, the semiconductor device 1 is effective when using the circuit board 2 including the curved corner portion 7.

The first main surface 2a of the circuit board 2 has thereon an external connecting terminal 8 to be an input/output terminal of the memory card. Further, the first main surface 2a of the circuit board 2 includes a first wiring network 9 in the region other than the region where the external connecting terminal 8 is formed. The first wiring network 9 is covered by an insulating layer 10 using an insulating adhesive seal or insulating adhesive tape, and is insulated thereby. The first wiring network 9 is formed to have a longer distance L11 from the long side 4A with the cut-out portion 5 and the constricted portion 6 than distance from at least one of the other sides.

Specifically, the first wiring network 9 is formed so that the distance L11 from the long side 4A with the cut-out portion 5 and the constricted portion 6 to the first wiring network 9 becomes larger than a distance L12 from the short side 3B to the first wiring network 9 and a distance L13 from a long side 4B to the first wiring network 9 (L11>L12, L11>L13). Note that the distances compared with the distance L11 from the long side 4A are the distances L12, L13 from the short side 3B and the long side 4B, respectively, to which the first wiring network 9 is close, and the distance from the short side 3A through the region formed the external connecting terminal 8 is excluded. The distance L11 from the long side 4A is larger than the distance from each of the other sides except the side through the formation region of the external connecting terminal 8.

As in the distance L11 from the long side 4A with the cut-out portion 5 and the constricted portion 6, the first wiring network 9 has larger distances from the R-shaped corner portions 7 of the circuit board 2 than the distances (L12 and L13) from the other sides 3B, 4B. Thus, the first wiring network 9 is formed so that the distance L11 from the long side 4A with the cut-out portion 5 and the constricted portion 6 and the distances from the curved corner portions (corners having a R shape) 7 of the circuit board 2 become larger than the distances (L12, L13) from the other sides 3B, 4B.

Figure 4:
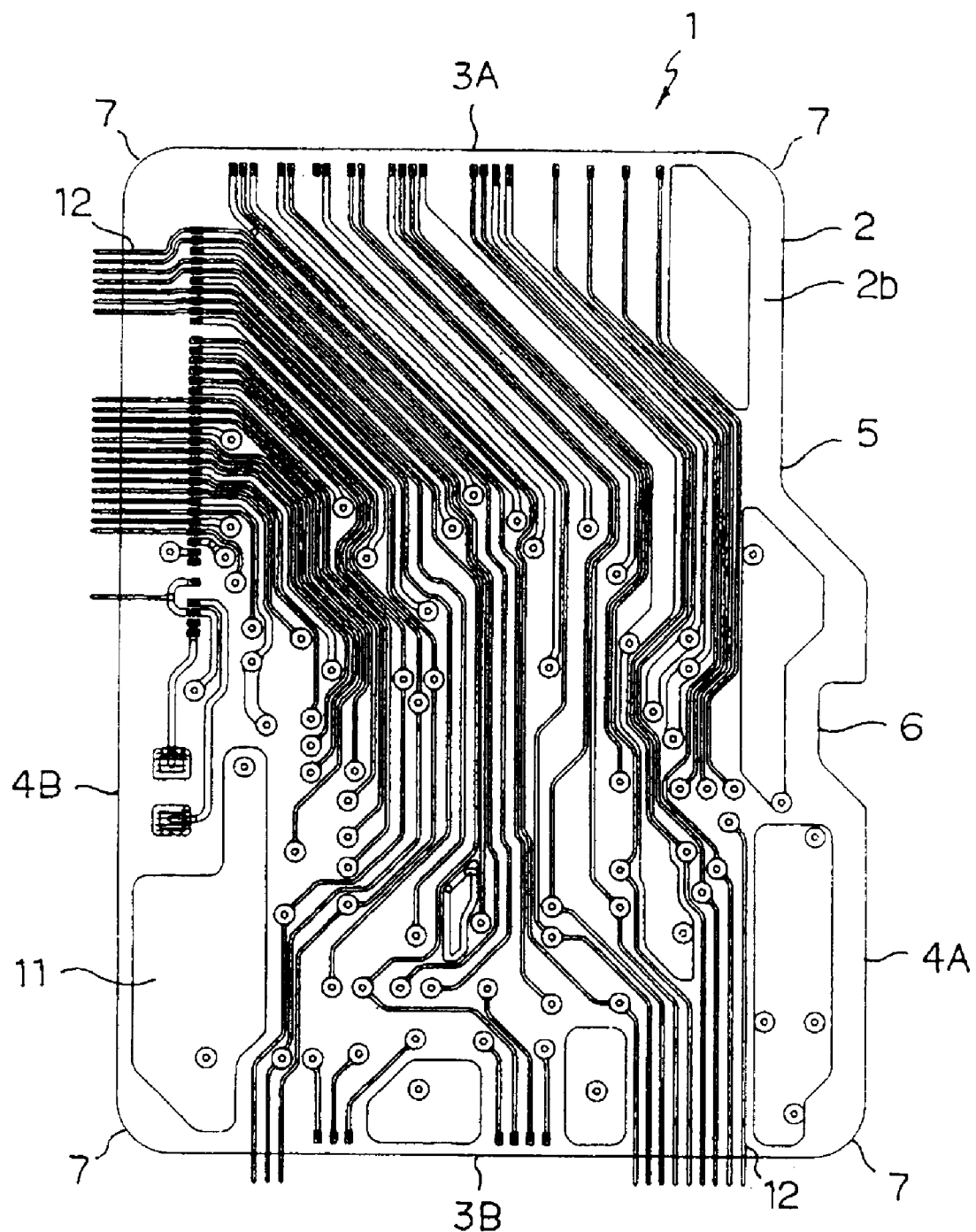
FIG. 4 is a view showing an example of a second wiring network provided on a second main surface of a circuit board composing the semiconductor device shown in FIG. 1.

On a second main surface 2b of the circuit board 2, a second wiring network 11 including a connection pad at the time of a wire bonding and the like is provided. FIG. 4 shows a configuration example of the second wiring network 11. As in the first wiring network 9, the second wiring network 11 is formed so that a distance L21 from the long side 4A with the cut-out portion 5 and the constricted portion 6 becomes larger than the distances from the other sides, namely the short side 3A, the short side 3B, and the long side 4B.

The second wiring network 11 includes plating lead wires 12 to form the external connecting terminal 8 and the like by electrolytic plating. The plating lead wires 12 are drawn out toward the sides except the long side 4A with the cut-out portion 5 and the constricted portion 6, for example, toward the short side 3B and the long side 4B. In FIG. 4, the plating lead wires 12 are drawn out to the short side 3B and the long side 4B, proving that the distances from the short side 3B and the long side 4B to the second wiring network 11 are 0 (zero). Accordingly, the second wiring network 11 is formed so that the distance L21 from the long side 4A becomes larger than the distance from the short side 3A, further the distances (virtually 0 (zero)) from the short side 3B and the long side 4B.

As in the distance L21 from the long side 4A with the cut-out portion 5 and the constricted portion 6, the second wiring network 11 has larger distances from the R-shaped corner portions 7 of the circuit board 2 than the distance (for example, L22) from the other side. The second wiring network 11 is formed so that the distance L21 from the long side 4A with the cut-out portion 5 and the constricted portion 6 as well as the distances from the curved corner portions (corners having a R shape) 7 of the circuit board 2 become larger than the distance from each of the other sides 3A, 3B and 4B.

The second wiring network 11 is drawn out to the short side 3B and the long side 4B. Meanwhile, a region having no wiring formed (non-wiring region X) is provided between the long side 4A with the cut-out portion 5 and the constricted portion 6 and the second wiring network 11. The non-wiring region X is also provided between the curved-corner portions 7 and the second wiring network 11, respectively. As will be described later, the non-wiring regions X are provided in a corresponding manner to the portions of which external shapes are processed by adopting a laser beam machining. Specifically, the non-wiring regions X are set between the second wiring network 11 and the portions (the long side 4A and the respective corner portions 7) of the circuit board 2, of which external shapes are processed by employing the laser beam machining. This is equally applied to the first wiring network 9.

Figure 5:
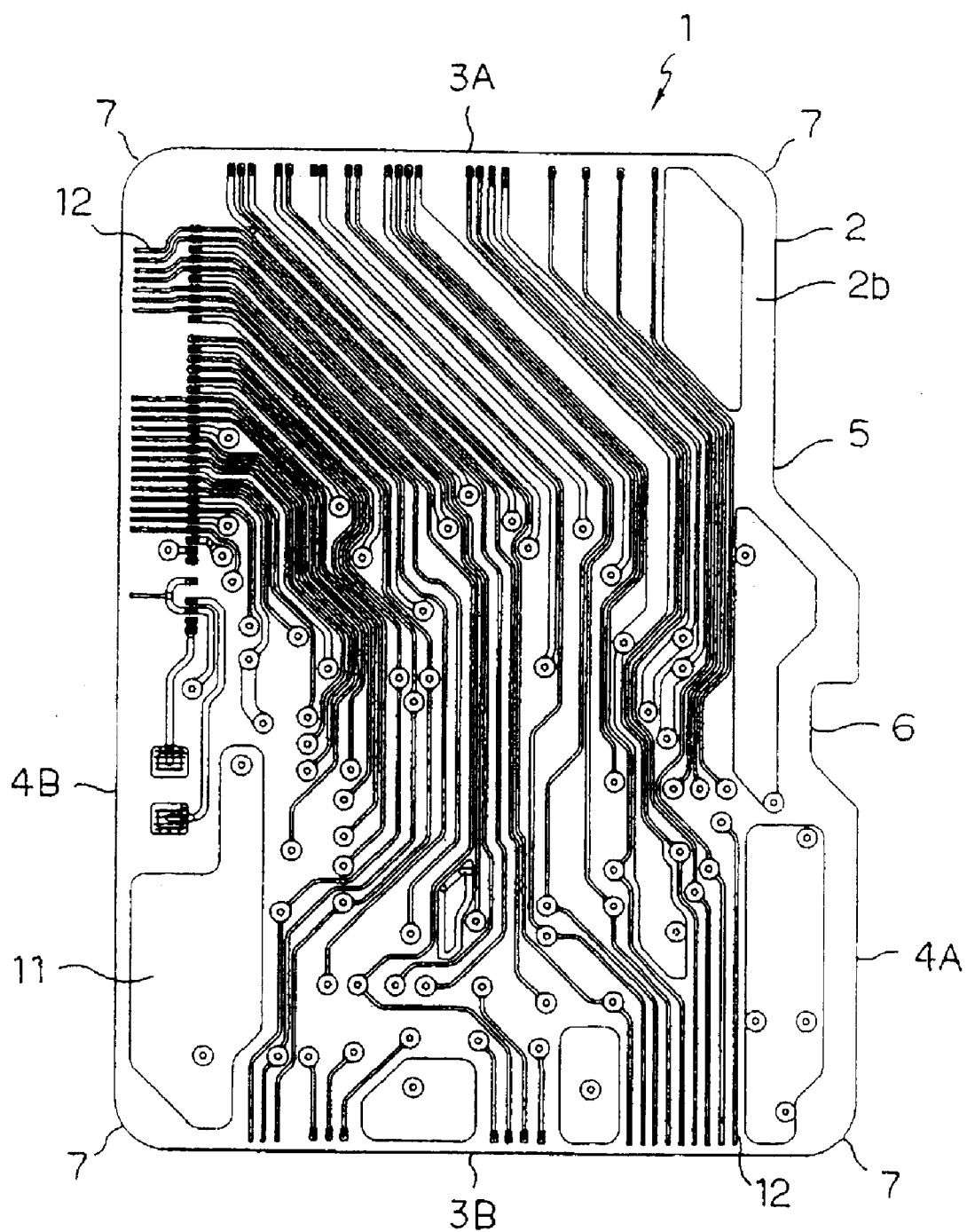
FIG. 5 is a view showing another example of the second wiring network provided on the second main surface of the circuit board composing the semiconductor device shown in FIG. 1.

In the plating lead wires 12, the portions existing in the vicinity of the short side 3B and the long side 4B may be removed by etching or the like as shown in FIG. 5, after forming the external connecting terminal 8 and the like by carrying out the electrolytic plating to the circuit board 2. In that case, as in the other wirings, the plating lead wires 12 are to exist at the portions distant a predetermined distance from the respective sides (the short side 3B, the long side 4B and the like) composing the external shape of the circuit board 2. Also, in the above-described case, the second wiring network 11 is formed so that the distance L21 from the long side 4A becomes larger than the respective distances from the short side 3A, the short side 3B and the long side 4B.

Figure 6:
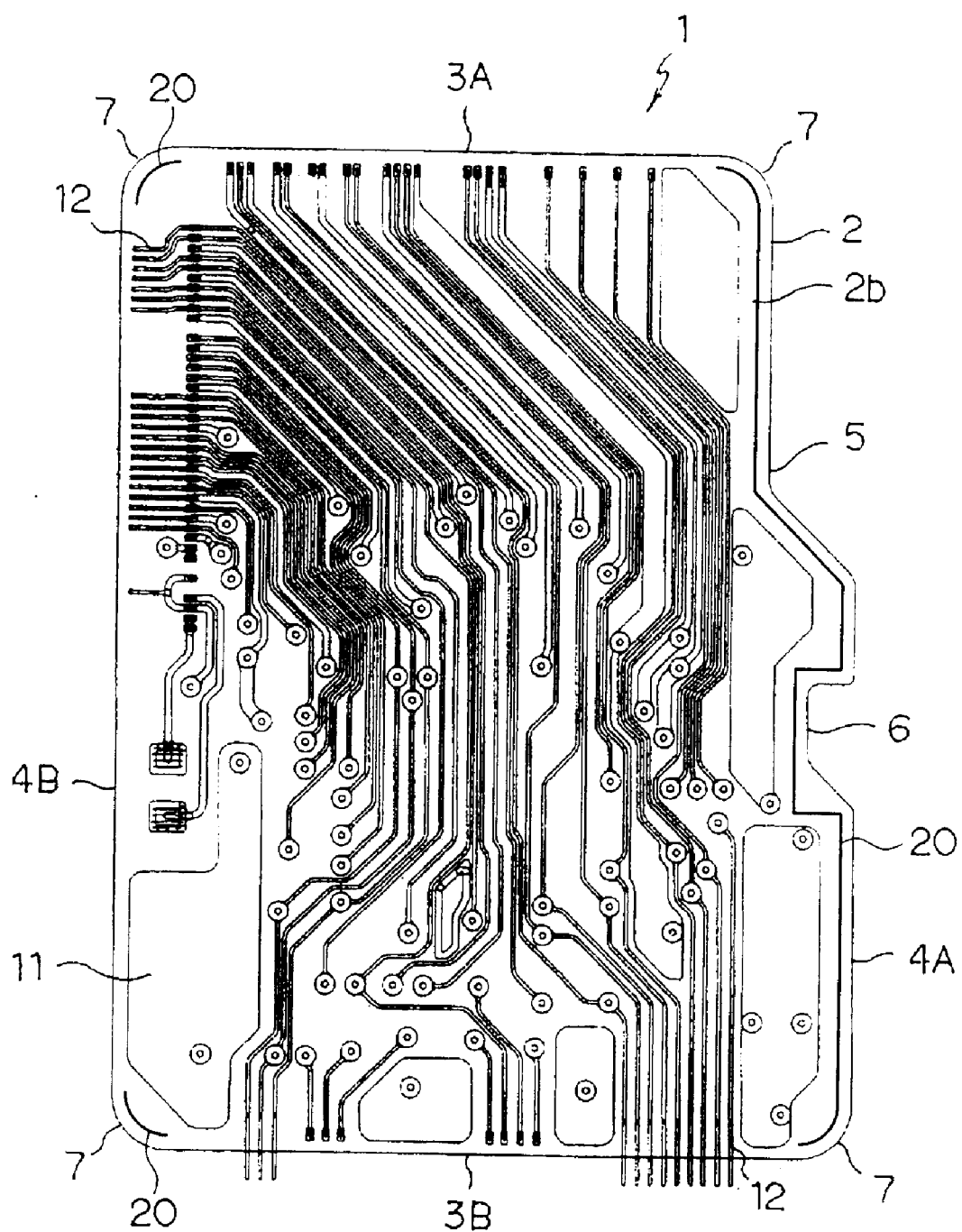
FIG. 6 is a view showing another example of the circuit board composing the semiconductor device shown in FIG. 1.

Further, in addition to that the distances from the long side 4A and the corner portions 7 respectively of the first and second wiring networks 9, 11 are made to be larger than the distances from the other sides 3A, 3B, 4B, the provision of dummy wirings between the first and second wiring networks 11 and the long side 4A and the corner portions 7, respectively, is also effective. FIG. 6 shows one example of dummy wirings 20 provided on the second main surface 2b of the circuit board 2. In the second main surface 2b of the circuit board 2, the dummy wiring 20 is provided between the long side 4A having the curved portions based on the cut-out portion 5 and the constricted portion 6 and the curved corner portions 7 and the second wiring network 11, respectively.

The dummy wirings 20 do not serve as electric wirings but to serve by protecting the second wiring network 11 against an inconvenience (carbonization of a board material and the like) caused by heat generated at the time of the laser beam machining. The dummy wirings 20 exist independently of the second wiring network 11. Even when the laser beam machining is carried out to the long side 4A and the corner portions 7 and thereby the board material of the machined portions is carbonized, the dummy wirings 20 halt the carbonization by themselves. Accordingly, the second wiring network 11 is surely prevented from being adversely affected by the carbonization of the board material. The dummy wirings 20 may be formed with respect to the first main surface 2a of the circuit board 2 as well. The dummy wiring 20 may be arranged between various laser-beam machined portions and the wiring network, and the wiring network is prevented from the adverse affect also in that case.

First and second semiconductor elements 13, 14 are mounted on the second main surface 2b of the circuit board 2. The first semiconductor element 13 is a semiconductor memory element such as of a NAND-type flash memory. The first semiconductor memory element 13 is adhered to the second main surface 2b of the circuit board 2 via a not-shown adhesive layer. The number of the first semiconductor memory element 13 to be mounted is not limited to one and two or more is also acceptable. The second semiconductor element 14 is, for example, a controller element. The controller element 14 is stacked and adhered on the semiconductor memory element 13 via a not-shown adhesive layer.

Respective electrode pads (not-shown) of the semiconductor memory element 13 and the controller element 14 are electrically connected to a connection pad provided to the second wiring network 11 via bonding wires 15, 16. The second wiring network 11 is electrically connected to the external connecting terminal 8 and the first wiring network 9 via a not-shown internal wiring (a through hole and so on) of the circuit board 2. On the second main surface 2b of the circuit board 2 having the semiconductor memory element 13 and the controller element 14 mounted thereon, a sealing resin layer 17 such as of epoxy resin is formed by molding. The semiconductor memory element 13 and the controller element 14 are sealed by the sealing resin layer 17.

The semiconductor memory element 13 and the controller element 14 mounted on the second main surface 2b of the circuit board 2 are sealed in a unified manner by the sealing resin layer 17 to form the semiconductor device (memory card) 1. The sealing resin layer 17 is formed by molding with respect to a plurality of the circuit boards 2 all at a time, as will be described later. The sealing resin layer 17 is cut together with the circuit board 2. In the sealing resin layer 17, the cut-out portion 5 and the constricted portion 6 having the same shape as of the circuit board 2 are formed. The same is equally applied to the respective corner portions of the sealing resin layer 17, and the same curved shape (R shape) as of the corner portions of the circuit board 2 are given thereto.

A slant portion 18 formed by cutting parts of the sealing resin layer 17 and the circuit board 2 is provided at the head side (the short side 3A side) of the sealing resin layer 17 with an aim to facilitate the insertion/removal of the memory card. The slant portion 18 is provided on the surface side (the first main surface 2a side of the circuit board 2) of the memory card. On the rear side (the short side 3B side) of the sealing resin layer 17, a handle portion 19 formed by partially heaping the sealing resin is provided. The handle portion 19 is provided on the rear surface side (the second main surface 2b side of the circuit board 2) of the memory card.

The semiconductor device 1 of the present embodiment forms a memory card (for example, a micro SD (trademark) card) by itself without using any case accommodating the semiconductor device such as a base card. The semiconductor device 1 is a memory card exposing its insulating layer 10 and sealing resin layer 17 outside without using a case. Therefore, the cut-out portion 5 and the constricted portion 6 indicating the head/rear and surface/rear surface directions and the like of the memory card are provided in the semiconductor device 1 itself. The cut-out portion 5 and the constricted portion 6 are formed by cutting the circuit board 2 together with the sealing resin layer 17.

The cut-out portion 5 and the constricted portion 6 are formed partially by a curved line, making a blade dicing be difficult. Therefore, the cut-out portion 5 and the constricted portion 6 are cut by adopting, for example, a laser beam machining. The laser beam machining may be adopted for the machining of the entire long side 4A with the cut-out portion 5 and the constricted portion 6. In that case, the curved portion needs to be cut at a lower speed than that to cut the linear portion. Therefore, a cooling efficiency at the time of the laser beam machining downs, raising a concern about an effect of heat generated at the cut portion.

In the semiconductor device 1 of the present embodiment, the distance from the side including the curved portions such as the cut-out portion 5 and the constricted portion 6 (here, the long side 4A) to the first and second wiring networks 9, 11 is made larger than the distance from the other sides to the first and second wiring networks 9, 11. Hence, the effect of the heat generated at the time of the laser beam machining with respect to the first and second wiring networks 9, 11 and the semiconductor elements 13, 14 can be prevented. Specifically, the insulation performance down and a short circuit in the wiring networks 9, 11 caused by the carbonization of the board material at the time of the laser beam machining, and the characteristic degradation in the semiconductor elements 13, 14 caused by the heat generated at the time of the laser beam machining can be prevented. The wiring region can be ensured sufficiently in that the distances from the other sides to the wiring networks 9, 11 are sufficiently small.

As for the curved corner portions 7, as in the distances L11, L21 from the long side 4A, the distances therefrom to the first and second wiring networks 9, 11 are sufficiently large. Therefore, the effect of the heat generated at the time of the laser beam machining of the corner portions 7 can be prevented. In order to prevent the effect of the heat generated at the time of the laser beam machining with high reproducibility, preferably, the distances from the sides to be subject to the laser beam machining (laser-beam machined portions) to the wiring networks 9, 11 are 0.5 mm or more. Specifically, preferably, the non-wiring region X has a shape having a width of 0.5 mm or more. In the present embodiment, the distances from the long side 4A and the corner portions 7 to the first and second wiring networks 9, 11 are 0.5 mm or more, respectively.

The second wiring network 11 includes the plating lead wires 12. The plating lead wire 12 needs to be drawn out to the side of the circuit board 2. In the present embodiment, the plating lead wires 12 are drawn out toward the sides except the long side 4A with the cut-out portion 5 and the constricted portion 6 (the short side 3B and the long side 4B). Therefore, the heat generated at the time of the laser beam machining does not possibly affect the plating lead wires 12. As will be described later, the liner short sides 3A, 3B and the long side 4B are cut by blade dicing, not possibly affected by the generated heat at the time of the machining.

Further, with the dummy wirings 20 being provided between the side (the long side 4A) having the curved portion based on the cut-out portion 5 and the constricted portion 6 and the curved corner portions 7 and the wiring networks 9, 11, it is surely possible to prevent the wiring networks 9, 11 from being affected by the heat generated at the time of the laser beam machining. The dummy wirings 20 are effective for preventing the insulation performance down, the short circuit, and the like caused by the carbonization of the board material due to the heat generated at the time of the laser beam machining.

According to the semiconductor device 1 of the present embodiment, it is possible to prevent the insulation performance down between the wiring networks 9, 11 and the short circuit caused by the effect of the heat generated when machining the curved portions by the laser beam machining. Further, the semiconductor elements 13, 14 are mounted on a part-mounting region in the second wiring network 11, raising a concern about the effect of the generated heat as in the second wiring network 11. In the present embodiment, the second wiring network 11 is arranged sufficiently distant from the portions to be cut by a laser beam, so that the characteristic degradation of the semiconductor elements 13, 14 due to the generated heat can be prevented. Based on the above, the production yield and reliability of the semiconductor device 1 and the memory card using the same can be improved.

Note that the semiconductor device 1 of the present invention is effective for the memory card composed simply by the semiconductor device 1 itself without using the case, however, does not necessarily exclude the memory card using the case such as the base card. Even in the case where the memory card is formed by accommodating the semiconductor device in the case, along with the downsizing and density increase of the card, the semiconductor device need to form the cut-out portion and constricted portion therein. Also, in that case, the semiconductor device 1 of the present invention is applicable.

Figure 7A:
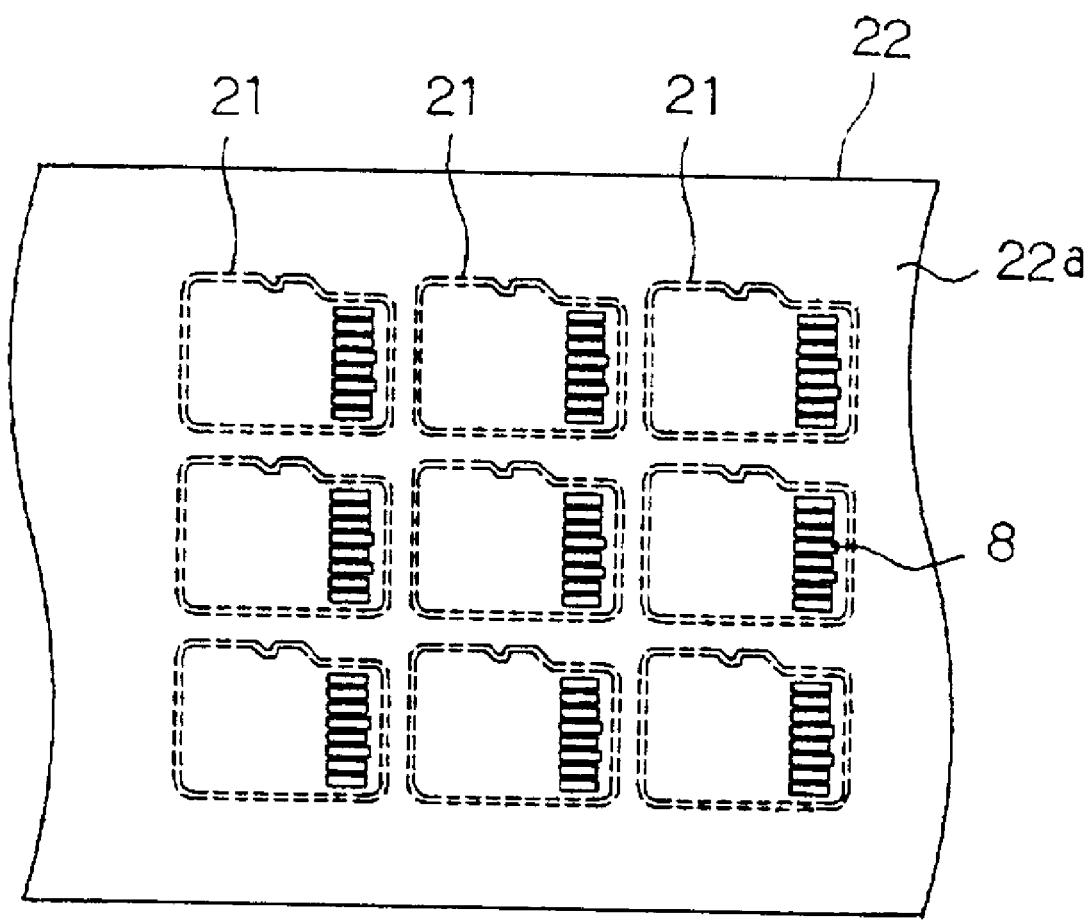
FIGS. 7A, 7B and 7C are views showing a manufacturing process of the semiconductor device shown in FIG. 1.

Subsequently, the description will be given of a manufacturing process of the above-described semiconductor device 1. First, as shown in FIG. 7A, a circuit board frame 22 including a plurality of device forming regions (memory cord forming regions) 21 is prepared. The plurality of the device forming regions 21 correspond to the circuit board 2, respectively. The external connecting terminals 8 are formed by adopting electrolytic plating with respect to the respective device forming regions 21, 21, . . . of the circuit board frame 22. At this time, the connection pads and the like are also formed by the electrolytic plating as may be necessary. The external connecting terminals 8 are formed on a main surface 22a side of the circuit board frame 22.

Figure 7B:
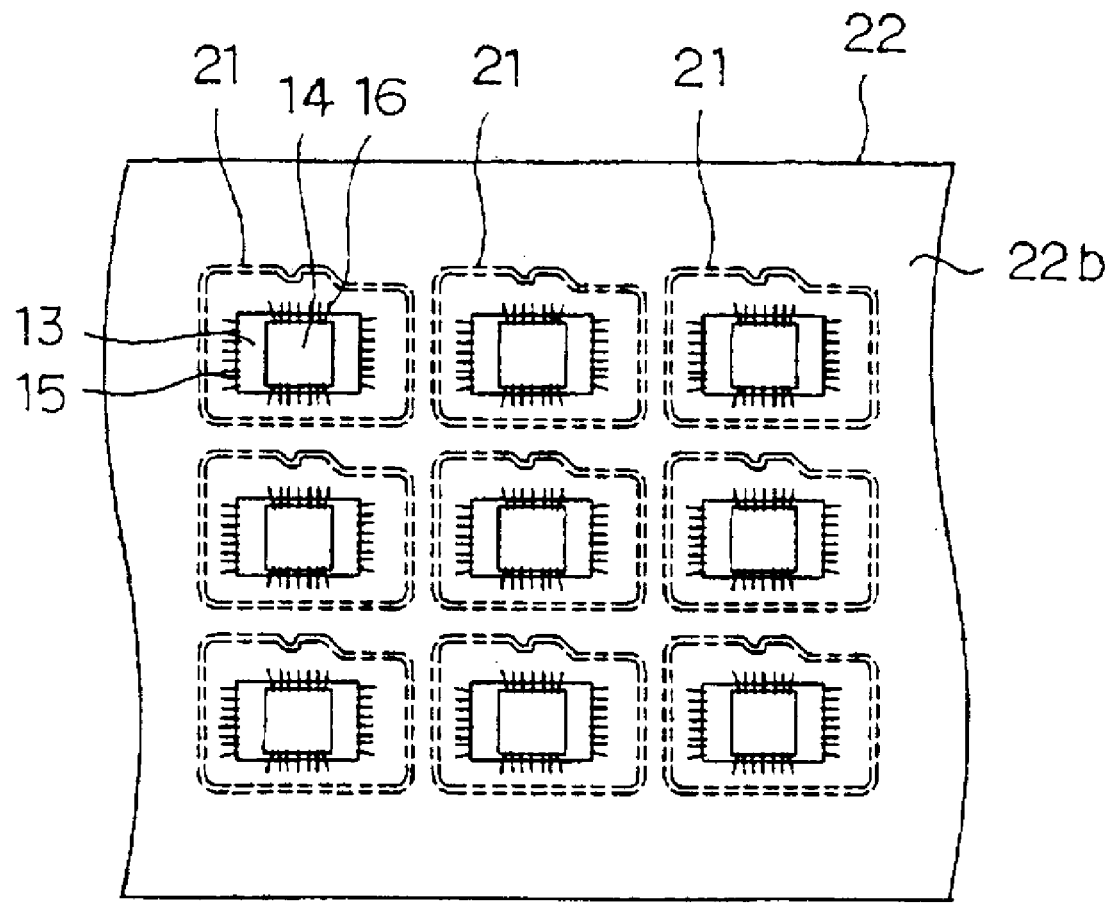

Subsequently, as shown in FIG. 7B, the semiconductor memory elements 13 are mounted on the second main surface 22b of the circuit board frame 22. The semiconductor memory elements 13 are mounted on the device forming regions 21, 21, . . . , respectively. The wire bonding is performed to the semiconductor memory elements 13, and electrodes of the semiconductor memory elements 13 and the wiring networks of the device forming regions 21 (each circuit board 2) are electrically connected via the bonding wires 15. Further, after the controller elements 14 are mounted on the semiconductor memory elements 13, electrodes of the controller elements 14 and the wiring networks of the device forming regions 21 (each circuit board 2) are electrically connected via the bonding wires 16.

Figure 7C:
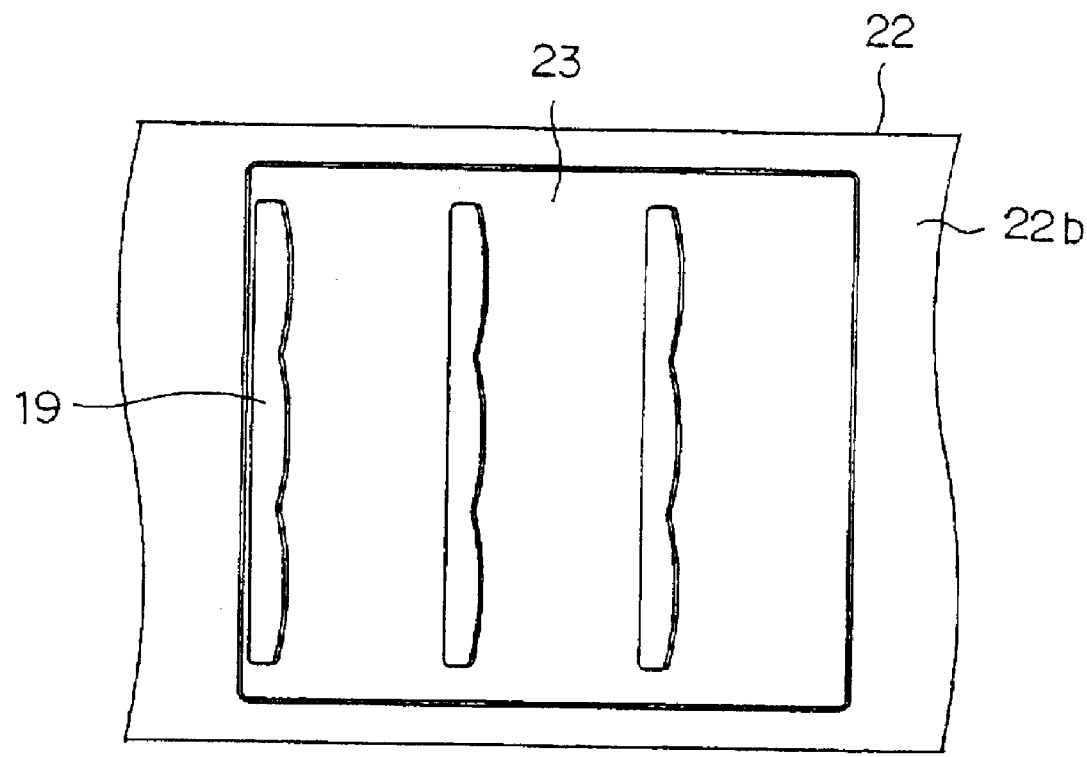

After that, as shown in FIG. 7C, a sealing resin 23 is formed by molding on the second main surface 22b of the circuit board frame 22. In the resin molding process, the sealing resin 23 covering the second main surface 22b of the circuit board frame 22 is formed by molding with a transfer molding or the like so that the semiconductor memory elements 13 and the controller elements 14 mounted on the plurality of device forming regions 21, respectively, are sealed at a time. The handle portions 19 are formed by heaping the part of the sealing resin 23 together when the sealing resin 23 is formed by molding.

Figure 8A:
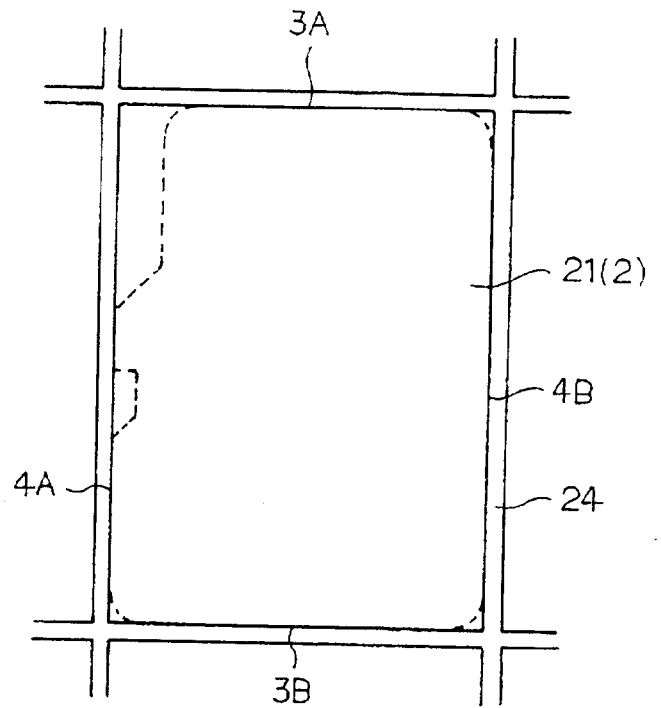
FIGS. 8A and 8B are plan views showing a cutting step of a circuit board frame in the manufacturing process of the semiconductor device shown in FIG. 1.

The circuit board frame 22 is sent to the cutting process, and the circuit board frame 22 is cut together with the sealing resin 23. In this manner, the single piece of semiconductor device 1 with the circuit board 2 is manufactured. In the cutting process of the circuit board frame 22, as shown in FIG. 8A, firstly, the outer peripheral of the device forming region 21 is cut linearly. In the cutting of the linear portion, the blade dicing exhibiting a higher cutting speed is adopted. A numerical reference 24 denotes a cutoff line for the blade dicing. The short sides 3A, 3B and the long side 4B of the circuit board 2 except the respective corner portions 7 are processed by the blade dicing only. Accordingly, even the distances to the wiring networks 9, 11 are small, there is no need to concern about the effect of the generated heat.

Figure 8B:
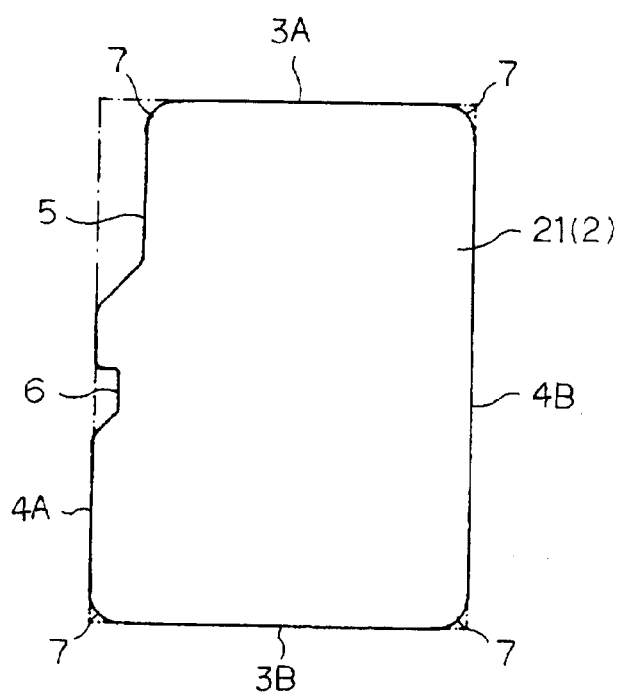

Subsequently, as shown in FIG. 8B, the cut-out portion 5 and the constricted portion 6 are formed by the cutting of the laser beam machining and, at the same time, the corner portions 7 are processed to have an R shape, respectively. As described above, the laser beam machining of the curved portion raises the concern about the effect of the generated heat, however, here, since the distances from the long side 4A and the respective corner portions 7 to the wiring networks 9, 11 are substantially large, allowing preventing the insulation performance down between the wirings and the short circuit caused by the effect of the heat generated at the time of the cutting. By employing the dummy wiring, the insulation performance down between the wirings and the short circuit can be prevented more surely. Further, the characteristic degradation of the semiconductor elements 13, 14 to be mounted on the element mounting region of the second wiring network 11 can be prevented as well.

Figure 9A:
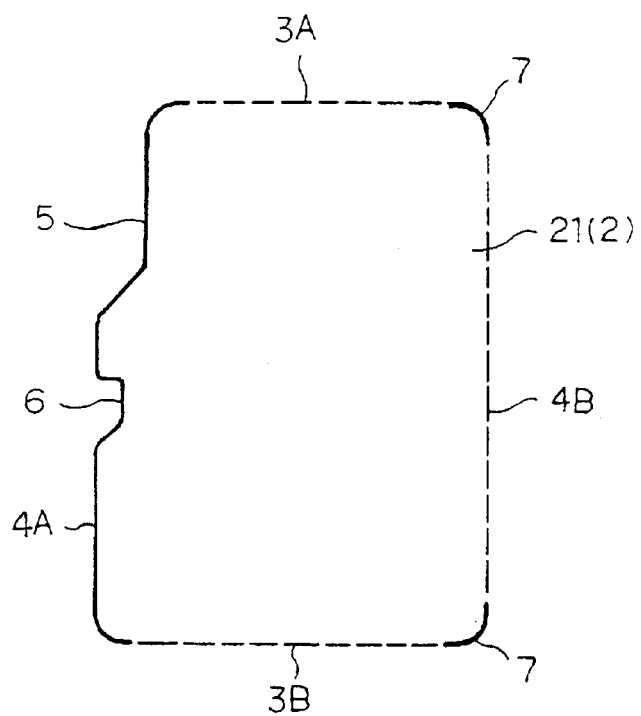
FIGS. 9A and 9B are plan views showing another cutting step of the circuit board frame in the manufacturing process of the semiconductor device shown in FIG. 1.
Figure 9B:
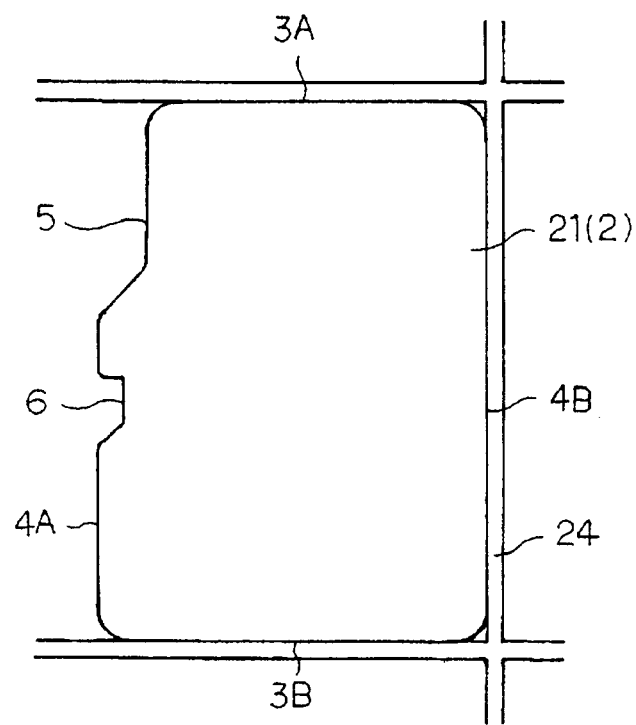

Note that the blade dicing and the laser beam machining may be reversed in terms of order. In other words, as shown in FIG. 9A, the long side 4A of the device forming region 21 with the cut-out portion 5 and the constricted portion 6 and the respective corner portions 7 are laser-beam machined. In the drawing, a full line shows a portion to be cut by the laser beam machining. In the processing of the long side 4A, it is acceptable to adopt the laser beam machining only to form the cut-out portion 5 and the constricted portion 6, however, when the laser beam machining is adopted to process the entire long side 4A including the above-stated portions, processing efficiency is improved. The long side 4A including the corner portions 7 at both the end thereof is laser-beam machined. After that, as shown in FIG. 9B, the short sides 3A, 3B and the long side 4B in the device forming region 21 are blade diced to manufacture the semiconductor device 1.

According to the manufacturing process of the semiconductor device 1, the blade dicing exhibiting a higher cutting speed is adopted to cut the linear portion, and the laser beam machining is adopted only to process the cut-out portion 5 and the constricted portion 6 including the curved portion, respectively, and the corner portions 7. Accordingly, the processing efficiency in the cutting step can be improved compared with the case where the entire outer periphery of the circuit board 2 is cut by the laser beam machining. On the basis of the above, the long side 4A and the corner portions 7 have a sufficiently large distance with respect to the wiring networks 9, 11, so that the insulation performance down between the wirings, the short circuit, and the characteristic degradation of the semiconductor elements 13, 14 can be prevented. Accordingly, the semiconductor device 1 with high reliability can be manufactured with high efficiently at a high production yield.

Note that the semiconductor device of the present invention is not limited to the above-described embodiment and is applicable to various types of semiconductor devices of which at least one side composing the external shape of the circuit board is provided with the curved portion. The present invention is not limited to the semiconductor device for the memory card. Further, the concrete structure of the semiconductor device and the memory card of the present invention may be modified variously as long as they satisfy the basic structure of the present invention. Furthermore, the embodiment may be extended or altered within the scope of the technical spirit of the present invention and the extended or altered embodiment is also within the technical scope of the present invention.

The invention claimed is:

1. A semiconductor device, comprising:
   a circuit board including a first main surface having a first wiring network formed thereon, a second main surface opposite the first main surface having a second wiring network formed thereon, and a curved portion provided in at least one side of an external shape thereof;
   a semiconductor elements mounted on at least one of the first and second main surfaces of the circuit board, having electrode pads; and
   bonding wires electrically connecting the first or second wiring network and the electrode pads of the semiconductor element,
   wherein a distance from the side including the curved portion of the circuit board to the first wiring network is larger than a distance from at least one of the other sides of the circuit board to the first wiring network, and a distance from the side including the curved portion of the circuit board to the second wiring network is larger than a distance from at least one of the other sides of the circuit board to the second wiring network.

2. The semiconductor device as set forth in claim 1, wherein the distances from the side including the curved portion of the circuit board to the first and second wiring networks are 0.5 mm or more.

3. The semiconductor device as set forth in claim 1, wherein the circuit board includes a cut-out portion provided in the side including the curved portion.

4. The semiconductor device as set forth in claim 1, wherein the circuit board includes a curved corner portion, and a distance from the curved corner portion to the first wiring network is larger than the distance from the other side to the first wiring network, and a distance from the curved corner portion to the second wiring network is larger than the distance from the other side to the second wiring network.

5. The semiconductor device as set forth in claim 1, wherein the first or second wiring network includes a wiring line which is drawn out toward the other side of the circuit board, and an end of the wiring line exists at a portion distant from the other side.

6. The semiconductor device as set forth in claim 5, wherein the wiring line is a plating lead wire, and an end of the plating lead wire exists at a portion distant from the other side by removing a portion located at the other side in a vicinity of the plating lead wire after plating to the circuit board.

7. A semiconductor device, comprising:
   a circuit board including a first main surface having a first wiring network formed thereon, a second main surface opposite the first main surface having a second wiring network formed thereon, and a curved portion provided in at least one side of an external shape thereof;
   an external connecting terminal formed in a region except a region where the first wiring network is formed on the first main surface of the circuit board;

a semiconductor element, mounted on the second main surface of the circuit board, having electrode pads; and bonding wires electrically connecting the second wiring network and the electrode pads of the semiconductor element, wherein a distance from the side including the curved portion of the circuit board to the first wiring network is larger than a distance from at least one of the other sides of the circuit board to the first wiring network, and a distance from the side including the curved portion of the circuit board to the second wiring network is larger than a distance from at least one of the other sides of the circuit board to the second wiring network.

8. The semiconductor device as set forth in claim 7, wherein the distances from the side including the curved portion of the circuit board to the first and second wiring networks are 0.5 mm or more.

9. The semiconductor device as set forth in claim 7, wherein the circuit board includes a cut-out portion provided in the side including the curved portion.

10. The semiconductor device as set forth in claim 7, wherein the circuit board includes a curved corner portion, and a distance from the curved corner portion to the first wiring network is larger than the distance from the other side to the first wiring network, and a distance from the curved corner portion to the second wiring network is larger than the distance from the other side to the second wiring network.

11. The semiconductor device as set forth in claim 7, wherein the second wiring network includes a wiring line which is drawn out toward the other side of the circuit board, and an end of the wiring line exists at a portion distant from the other side.

12. The semiconductor device as set forth in claim 11, wherein the wiring line is a plating lead wire, and a end of the plating lead wire exists at a portion distant from the other side by removing a portion located at the other side in a vicinity of the plating lead wire after plating to the circuit board.

13. A memory card, comprising:

a circuit board including a first main surface having a first wiring network formed thereon, a second main surface opposite the first main surface having a second wiring network formed thereon, and a curved portion provided in at least one side of an external shape thereof;

an external connecting terminal formed in a region except a region where the first wiring network is formed on the first main surface of the circuit board;

an insulating layer formed on the first main surface of the circuit board to cover the first wiring network;

a semiconductor memory elements mounted on the second main surface of the circuit board, having electrode pads;

bonding wires electrically connecting the second wiring network and the electrode pads of the semiconductor memory element; and a sealing resin layer formed on the second main surface of the circuit board to seal the semiconductor memory element, wherein a distance from the side including the curved portion of the circuit board to the first wiring network is larger than a distance from at least one of the other sides of the circuit board to the first wiring network, and a distance from the side including the curved portion of the circuit board to the second wiring network is larger than a distance from at least one of the other sides of the circuit board to the second wiring network.

14. The memory card as set forth in claim 13, further comprising:

a controller element mounted on the second main surface of the circuit board.

15. The memory card as set forth in claim 13, wherein the distances from the side including the curved portion of the circuit board to the first and second wiring networks are 0.5 mm or more.

16. The memory card as set forth in claim 13, wherein the circuit board includes a cut-out portion provided in the side including the curved portion.

17. The memory card as set forth in claim 13, wherein the circuit board includes a curved corner portion, and a distance from the curved corner portion to the first wiring network is larger than the distance from the other side to the first wiring network, and a distance from the curved corner portion to the second wiring network is larger than the distance from the other side to the second wiring network.

18. The memory card as set forth in claim 13, wherein the second wiring network includes a wiring line which is drawn out toward the other side of the circuit board, and an end of the wiring line exists at a portion distant from the other side.

19. The memory card as set forth in claim 18, wherein the wiring line is a plating lead wire, and a end of the plating lead wire exists at a portion distant from the other side by removing a portion located at the other side in a vicinity of the plating lead wire after plating to the circuit board.

20. The memory card as set forth in claim 13, wherein the curved portion of the substrate circuit board is formed by a laser beam machining, and a board material located at the curved portion is carbonized.

* * * * *